(12) United States Patent
Wich

(10) Patent No.: US 7,245,152 B2
(45) Date of Patent: Jul. 17, 2007

(54) VOLTAGE-LEVEL SHIFTER

(75) Inventor: Mathew Todd Wich, Colorado Springs, CO (US)

(73) Assignee: Atmel Corporation, San Jose, CA (US)

( * ) Notice: Subject to any disclaimer, the term of this patent is extended or adjusted under 35 U.S.C. 154(b) by 71 days.

(21) Appl. No.: 11/119,638

(22) Filed: May 2, 2005

(65) Prior Publication Data

US 2006/0279332 A1 Dec. 14, 2006

(51) Int. Cl.
*H03K 19/0175* (2006.01)
*H03L 5/00* (2006.01)

(52) U.S. Cl. ............................ 326/63; 326/80; 326/62; 327/333

(58) Field of Classification Search ................ 326/63, 326/62, 80; 327/333
See application file for complete search history.

(56) References Cited

U.S. PATENT DOCUMENTS

| | | | | |
|---|---|---|---|---|
| 4,660,062 A * | 4/1987 | Nishizawa et al. | ......... | 257/345 |
| 5,264,744 A * | 11/1993 | Mizukami et al. | ............ | 326/62 |
| 5,581,506 A * | 12/1996 | Yamauchi | .............. | 365/189.11 |
| 5,736,887 A * | 4/1998 | Spence | ........................ | 327/333 |
| 6,442,082 B2 * | 8/2002 | Taura et al. | ........... | 365/189.11 |
| 6,476,659 B1 * | 11/2002 | Patel et al. | ................. | 327/333 |
| 6,510,089 B2 | 1/2003 | Taura et al. | .......... | 365/189.011 |
| 6,642,769 B1 * | 11/2003 | Chang et al. | ............... | 327/333 |
| 6,650,168 B1 * | 11/2003 | Wang et al. | ................ | 327/333 |
| 6,661,274 B1 * | 12/2003 | Naka et al. | .................. | 327/333 |
| 6,677,798 B2 * | 1/2004 | Chang et al. | ............... | 327/333 |
| 6,717,452 B2 * | 4/2004 | Carpenter et al. | .......... | 327/333 |
| 6,949,951 B1 * | 9/2005 | Young et al. | ................. | 326/37 |
| 6,963,226 B2 * | 11/2005 | Chiang | ........................ | 326/68 |
| 7,102,410 B2 * | 9/2006 | Khan et al. | ................. | 327/333 |
| 7,180,329 B1 * | 2/2007 | Sia et al. | ....................... | 326/81 |
| 2002/0039042 A1 * | 4/2002 | Jinzai | ......................... | 327/333 |
| 2002/0050849 A1 * | 5/2002 | Hayashi et al. | ............. | 327/333 |
| 2004/0104756 A1 * | 6/2004 | Payne | ........................ | 327/333 |
| 2005/0017755 A1 | 1/2005 | Chiang | | |
| 2005/0134355 A1 * | 6/2005 | Maede et al. | ................ | 327/333 |
| 2005/0270066 A1 * | 12/2005 | Kozawa | ....................... | 326/81 |
| 2005/0285658 A1 * | 12/2005 | Schulmeyer et al. | ........ | 327/333 |

* cited by examiner

*Primary Examiner*—Rexford Barnie
*Assistant Examiner*—Thienvu Tran
(74) *Attorney, Agent, or Firm*—Sawyer Law Group LLP

(57) ABSTRACT

In a voltage-level shifter, an input line is configured to convey an input voltage to be shifted. A pair of transistors is coupled to and is configured to receive the input voltage from the input line. There is a first side and a second side, with each side comprising the following: a low-voltage transistor that is coupled to the pair of transistors, a medium-voltage transistor that is coupled to the low-voltage transistor, a high-voltage transistor that is coupled to the medium-voltage transistor, and an output line, which is coupled to the first and second sides, for providing an output voltage that is higher than the input voltage.

13 Claims, 3 Drawing Sheets

VOLTAGE-LEVEL SHIFTER

FIELD OF THE INVENTION

The present invention relates generally to integrated circuits, and specifically to a voltage-level shifter for an integrated circuit.

BACKGROUND OF THE INVENTION

Integrated circuits include many different components and are represented by many different designs. Examples of different designs are digital signal processors, central processing units, field-programmable gate arrays, memory, and so on. Non-volatile memory is one type of memory that preserves data with or without power. Manufacturers of non-volatile memory work continuously to improve the speed at which their memory operates and voltage shifters are one component in memory.

One problem with memory speed is found in the time it takes to shift lower input voltages to the higher voltages used by memory. Conventional voltage shifters shift relatively low voltage, for example a 1.8V logic signal, to a relatively high voltage, for example a 3.3V signal.

FIG. 1 is one example of a conventional voltage-level shifter 10. Shifter 10 receives a 1.8V signal at input 12 and "shifts" it to an output signal of 3.3V at output 14. Shifter 10 operates as follows.

Transistors 16 and 18 are thin-oxide, short-channel transistors that are inherently fast and small, but only tolerate voltage up to VDD from power supply 20. Transistors 16 and 18 are in an inverter configuration.

Transistors 22 and 24 are thick-oxide, long-channel transistors (relative to transistors 16 and 18) that can therefore tolerate higher voltage than transistors 16 and 18. Transistor 22 is connected to input 12 and receives the same input signal as transistors 18 and 16. Transistor 24, however, receives the inverted signal of input 12, because of the inverter configuration of transistors 16 and 18. Assuming input 12 is a high (VDD) voltage, then the gate of transistor 24 is deasserted (for example, a low voltage for N-channel transistors), while the gate of transistor 22 is asserted (for example, a high voltage for N-channel transistors).

Transistor 22 turns on, or begins conducting, because it is being asserted, while transistor 24 turns off because it's being deasserted. The effect of this is to turn on, or assert transistor 26 and turn off, or deassert transistor 28, which are both connected to power 30 at voltage level VCC, which is at 3.3V. Transistors 28 and 26 are thick-oxide, long, P-channel transistors (relative to transistors 16 and 18) that can therefore tolerate higher voltage than transistors 16 and 18. Because transistor 26 is on and conducting, while transistor 24 is off, output 14 is at VCC. Therefore the input voltage of 1.8V has been level-shifted to 3.3V. If input 12 goes to zero, then the opposite holds true, in that output 14 will go to zero as well.

One problem with voltage-level shifter 10 is that it is slow. In many electronic systems, memory being one example, rapidly functioning circuits are important to overall system performance.

Accordingly, what is needed is a faster voltage-level shifter. The present invention addresses such a need.

SUMMARY OF THE INVENTION

The present invention provides a voltage-level shifter comprising the following. In a voltage-level shifter, an input line is configured to convey an input voltage to be shifted. A pair of transistors is coupled to and is configured to receive the input voltage from the input line. There is a first side and a second side, with each side comprising the following: a low-voltage transistor that is coupled to the pair of transistors, a medium-voltage transistor that is coupled to the low-voltage transistor, a high-voltage transistor that is coupled to the medium-voltage transistor, and an output line, which is coupled to the first and second sides, for providing an output voltage that is higher than the input voltage.

According to the method and system disclosed herein, the present invention replaces the high-voltage, switching transistors with low-voltage transistors in series with medium-voltage transistors. The low-voltage transistors have very low "on" resistance and low capacitance, making them relatively fast, while the medium voltage transistors respond more quickly than the high-voltage transistors to an asserting signal. The overall effect of the replacement is to increase the conversion speed from input to output voltage.

DETAILED DESCRIPTION OF THE INVENTION

The present invention relates generally to integrated circuits, and specifically to a voltage-level shifter for an integrated circuit. The following description is presented to enable one of ordinary skill in the art to make and use the invention and is provided in the context of a patent application and its requirements. Various modifications to the preferred embodiments and the generic principles and features described herein will be readily apparent to those skilled in the art. Thus, the present invention is not intended to be limited to the embodiments shown, but is to be accorded the widest scope consistent with the principles and features described herein.

Figure 2:
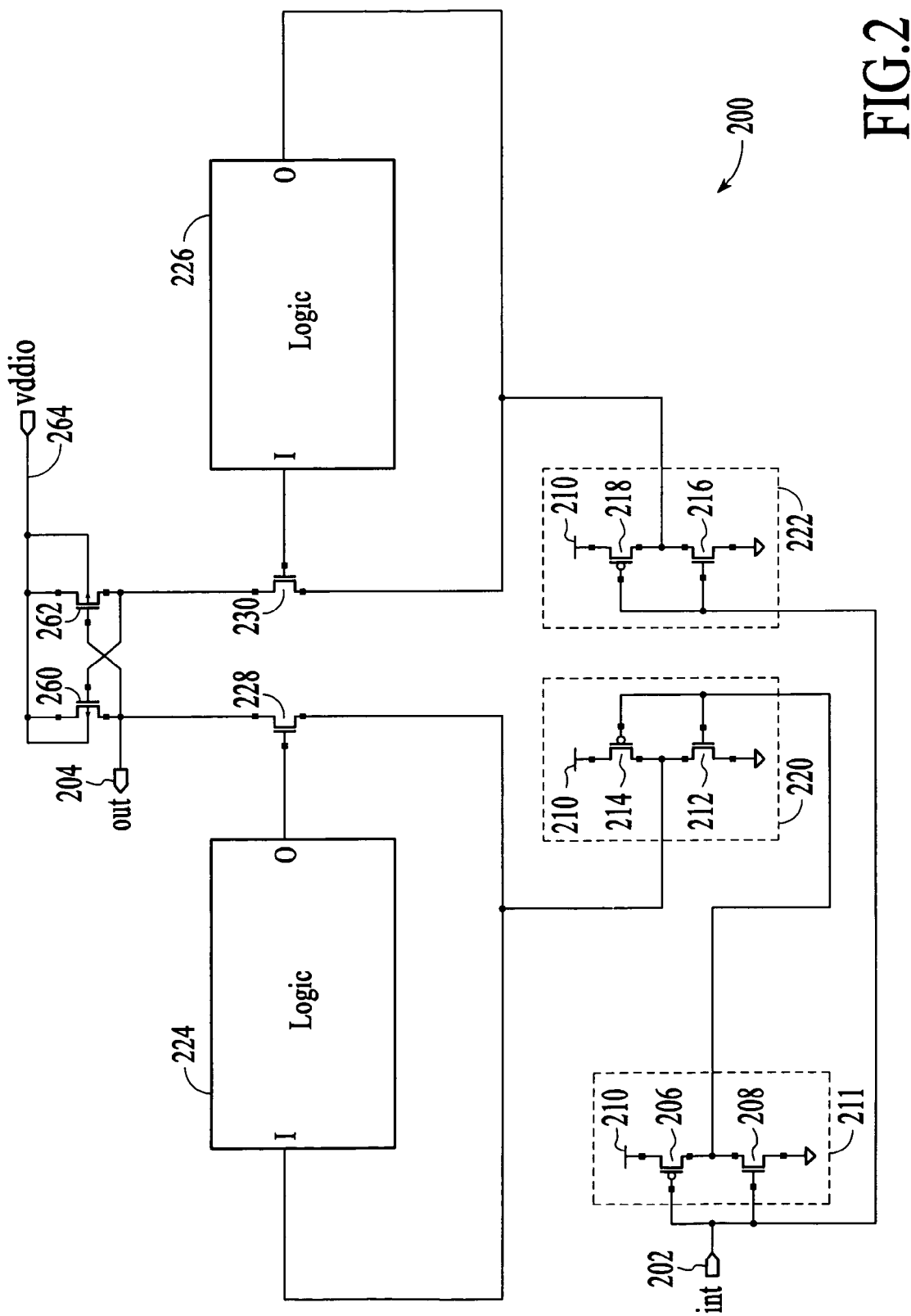
FIG. 2 is a schematic diagram illustrating a voltage-level shifter according to one embodiment of the invention.

FIG. 2 is a schematic diagram illustrating a voltage-level shifter 200 according to one embodiment of the invention. Shifter 200 receives an input voltage, for example 1.8V at input 202, and shifts the input voltage to an output voltage of 3.3V, for example, at output 204. Different input and output voltages may be used, with corresponding changes in transistor size when necessary. Shifter 200 operates as follows.

Transistors 206 and 208 are thin-oxide, short-channel transistors that are inherently fast and small, but only tolerate voltage up to VDD from power supply 210. In one embodiment, VDD may be 1.8V at the power supply node with transistors 206 and 208 having an oxide thickness of 32 Angstroms and a channel length of 0.18 µm. Transistor 208 is an N-channel transistor while transistor 206 is a P-channel transistor. Transistor pair 211 is in an inverter configuration.

Transistors 206 and 208 receive the input voltage from input 202. Because transistor pair 211 is configured as an inverter, transistor pair 211 outputs an inverted signal of input voltage. For example, if input voltage is high, transistor pair 211 outputs a low voltage, and vice versa.

Transistors 212, 214, 216, and 218 are also thin-oxide, short-channel transistors that are inherently fast and small, but only tolerate voltages up to VDD from power supply 210. In one embodiment, VDD may be 1.8V while transistors 212, 214, 216, and 218 have an oxide thickness of 32 Angstroms and a channel length of 0.78 μm. Transistors 214 and 218 are P-channel transistors while transistors 212 and 216 are N-channel transistors. Transistor pairs 220 and 222 are in inverter configurations.

Transistor pair 222 is connected to input 202 and receives the same input signal as transistor pair 211. Transistor pair 220, however, receives the inverted signal of input 202, because of the inverter configuration of transistor pair 211. Assuming input 202 is a high (VDD) voltage, then transistor pair 220 receives a logic low input (for example, a low voltage for N-channel transistors), while transistor pair 222 receives a logic high input (for example, a high voltage for N-channel transistors). Transistor pair 220 produces an assert signal while transistor pair 222 produces a deassert signal with a high (VDD) voltage input.

Figure 3:
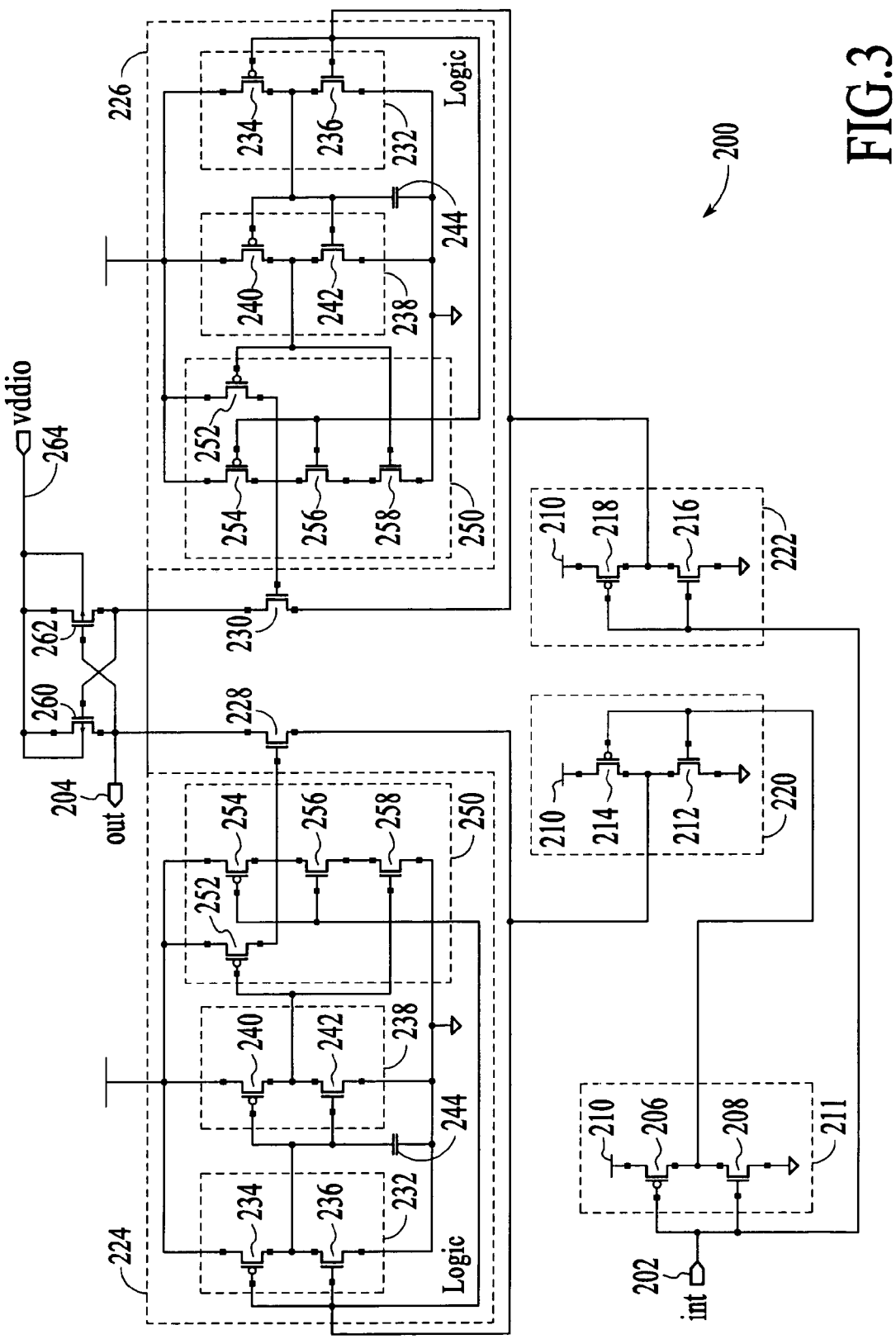
FIG. 3 is a schematic diagram illustrating a voltage-level shifter according to one embodiment of the invention.

Circuits 224 and 226 have been described in FIG. 3 with greater detail. FIG. 3 is identical to FIG. 2 with the addition of a detailed embodiment of circuits 224 and 226. Circuits 224 and 226 are, in FIG. 3, identical to one another and produce the logic equivalent of FIG. 4. Circuits 224 and 226 receive input from transistor pairs 220 and 222, respectively, and output to transistors 228 and 230, respectively. For simplicity, the function of circuits 224 and 226 is next described with respect to the logic implemented.

Figure 1:
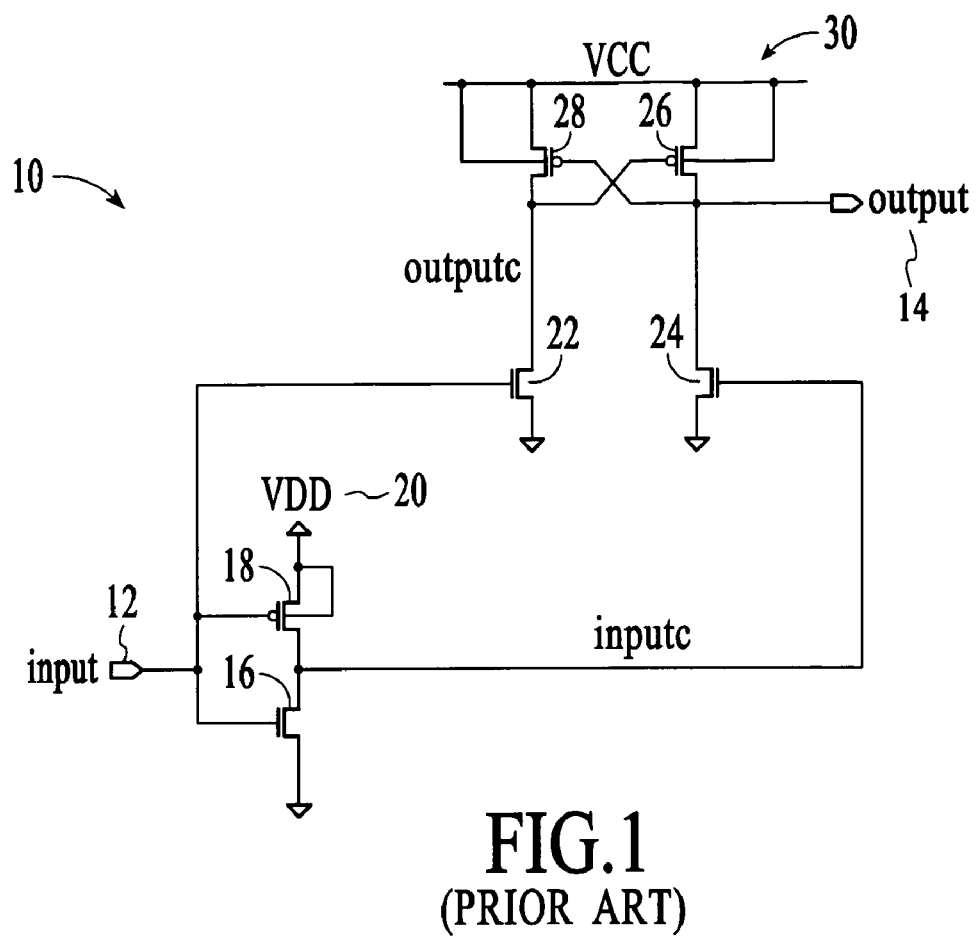
FIG. 1 is one example of a conventional voltage-level shifter.
Figure 4:
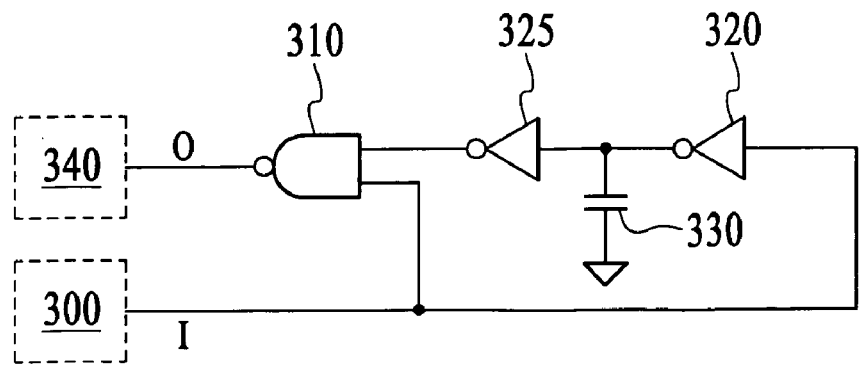
FIG. 4 is a schematic diagram illustrating one logic function implemented by a circuit of FIG. 3.

FIG. 4 is a schematic diagram illustrating one logic function implemented by the circuits 224 and 226 of FIG. 3. Input circuit 300 may be either of transistor pairs 220 or 222 from FIG. 3 and is connected to NAND gate 310. The logical effect of inverters 320 and 325 is to cancel one another out, therefore NAND gate 310 transmits a high (VDD) voltage (or assert for N-channel transistors) to output circuit 340 when input circuit 300 is a low voltage (or deassert for N-channel transistors). Output circuit 340 may be either of transistors 228 or 230 from FIG. 2 or 3.

When input circuit 300 goes from high to low logic, there is a delay as NAND gate 310 receives the low input, implements it and outputs a high logic to output circuit 340. This delay is part of the normal operating characteristic of NAND gate 310. However, when input circuit 300 goes from low to high logic, there is an additional delay introduced by inverters 320 and 325, and capacitor 330. In order for NAND gate 310 to switch from a high logic output to a low logic output, both inputs to NAND gate 310 must be high, hence there is additional delay as inverters 325 and 320 process the signal and capacitor 330 discharges, and then NAND gate 310 receives both inputs as high logic. The significance of this additional delay, when switching from high low logic input to logic input, will be discussed below.

Returning to FIG. 3, circuits 224 and 226 are described in relation to the logic described in FIG. 4. The components of each of circuits 224 and 226 have been labeled and described together because in this embodiment their function is identical. Transistor block 232 includes transistors 234 and 236 and is configured as an inverter, for example inverter 320 of FIG. 4. Transistor block 238 includes transistors 240 and 242 and is configured as an inverter, for example inverter 325 of FIG. 4. Capacitor 244 is connected between transistor blocks 232 and 238 and functions as capacitor 330 from FIG. 4. Transistor block 250 includes transistors 252, 254, 256 and 258 and functions as NAND gate 310 from FIG. 4. The effect of circuits 224 and 226 is to receive a signal from transistor pairs 220 and 222 respectively, invert the signal and deliver it to transistors 228 and 230. The transistors in circuits 224 and 226 drive transistors 228 and 230.

Continuing with FIG. 2, transistors 228 and 230 have, for example, a medium oxide thickness (relative to transistors 206, 208, 212, 214, 216, and 218) of 90 Angstroms and a threshold voltage of approximately zero volts. Transistors 228 and 230 are N-channel transistors and protect transistor pairs 220 and 222 from excessive voltage, allowing them to be built from low-voltage transistors that are smaller, have less capacitance, and have a lower "on" resistance, and are therefore faster than those transistors in conventional systems. Transistors 228 and 212, and also transistors 230 and 216, are in series and may be considered a functional replacement for some of the transistors in conventional systems. The series combination of transistor 228, having a low threshold voltage than conventional systems, with transistor 212, which is a low-voltage transistor and highly conductive, is more conductive than the single high-voltage device in conventional systems.

Continuing with the example of a high (VDD) voltage signal at input 202, transistor pair 220 outputs a high (VDD) voltage signal (or assert signal in this embodiment) to circuit 224, while transistor pair 222 outputs a low-voltage signal (or deassert signal in this embodiment) to circuit 226. Circuit 224 produces a low-voltage (OV) signal to transistor 228 while circuit 226 produces a high-voltage (VDD) signal to transistor 230.

Continuing with the description of the circuit, transistors 260 and 262 are thick-oxide, long, P-channel transistors (relative to transistors 228 and 230) that can therefore tolerate higher voltage than transistors 228 and 230. Transistors 260 and 262 are cross-coupled to one another and connected to power supply 264, the voltage level to which the input voltage should be shifted, for example 3.3V.

Continuing with the example of a high (VDD) voltage signal at input 202, transistor 228 receives a low voltage, or deassert signal while transistor 230 receives a high voltage, or assert signal. Transistors 228 and 212 are being deasserted in this example while transistors 230 and 216 are being asserted. The gate of transistor 260 is pulled to ground and therefore asserted. Because transistors 228 and 212 are deasserted, voltage from power supply 264 is brought to output 204. Likewise, high voltage deasserts the gate of transistor 262.

Conversely, when input 202 is low, transistor 216 is deasserted and the output of transistor pair 222 is high. In this embodiment, in order to completely turn off transistor 230, the gate voltage of transistor 230 should reach zero volts with zero volts at input 202 and the line between transistors 216 and 230 should rise above zero volts, otherwise transistor 230 may leak current due to its low threshold voltage. As input 202 goes from high to low, transistors 216 and 218 switch states. Transistor 230 does not switch until some time has passed, in part because it is slower relative to transistors 216 and 218, and in part due to the previously discussed additional delay from circuit 226. With transistors 218 and 230 on, and transistor 216 off, the voltage brought up by transistor 218 assists in raising the gate voltage of transistor 260 and thereby speeding up the level conversion. After the delay for switching transistor 230 is over, transistor 230 shuts off, the gate of transistor 260 has been brought up somewhat by transistor 218 and will be brought up by transistor 262 until it shuts off.

Advantages of the invention include improving the speed of voltage-level conversion with thin-oxide, low voltage transistors. The invention applies generally to voltage-level shifters and specifically to shifting voltages from a 1.8V input signal to a 3.3V output signal in a non-volatile memory.

The present invention has been described in accordance with the embodiments shown, and one of ordinary skill in the art will readily recognize that there could be variations to the embodiments, and any variations would be within the spirit and scope of the present invention. The N and P-channel transistors are only exemplary, and one skilled in the art will recognize that each may be substituted for the other with subsequent design changes that are well known in the art. Also, the invention may be applied in any integrated circuit utilizing a level shifter. Accordingly, many modifications may be made by one of ordinary skill in the art without departing from the spirit and scope of the appended claims.

I claim:

1. A voltage-level shifter comprising:
   an input to receive an input voltage;
   a first pair of transistors coupled to the input, the first pair of transistors to receive the input voltage, invert the input voltage into a first signal, and output the first signal;
   a second pair of transistors coupled to the first pair of transistors, the second pair of transistors to receive the first signal, invert the first signal into a second signal, and output the second signal;
   a third pair of transistors coupled to the input, the third pair of transistors to receive the input voltage, invert the input voltage into a third signal, and output the third signal;
   a first transistor coupled to the second pair of transistors, wherein when asserted the first transistor is configured to pass the second signal to a third transistor, the second signal being an assert signal for asserting the third transistor;
   a second transistor coupled to the third pair of transistors, wherein when asserted the second transistor is configured to pass the third signal to a fourth transistor, the third signal being an assert signal for asserting the fourth transistor,
   wherein when asserted the third transistor is configured to pass a deassert signal for deasserting the fourth transistor,
   wherein when asserted the fourth transistor is configured to pass an output voltage to an output of the voltage level shifter, the output voltage having a higher voltage level relative to the input voltage, the output voltage further representing a deassert signal for deasserting the third transistor.

2. The voltage-level shifter of claim 1, wherein each of the first pair of transistors, the second pair of transistors, and the third pair of transistors comprises thin-oxide, short-channel transistors.

3. The voltage-level shifter of claim 1, wherein the third transistor is cross-coupled to the fourth transistor.

4. The voltage-level shifter of claim 2, wherein:
   the first transistor and the second transistor have a higher voltage capacity than the second pairs of transistors and the third pair of transistors; and
   the first transistor and the second transistor respectively protect the second pair of transistors and the third pair of transistors from excessive voltage.

5. The voltage-level shifter of claim 4, wherein the fourth transistor and the third transistor respectively have a higher voltage capacity than the first transistor and the second transistor.

6. The voltage-level shifter of claim 4, wherein the first transistor and the second transistor comprise medium-oxide transistors with a thicker oxide relative to the thin-oxide transistors of the first pair of transistors, the medium-oxide transistors having a threshold voltage of approximately zero volts.

7. The voltage-level shifter of claim 1, further comprising:
   a first logic circuit coupled to the second pair of transistors and the first transistor, the first logic circuit to receive the second signal and output an assert signal for asserting the first transistor responsive to the second signal being at a low logic level; and
   a second logic circuit coupled to the third pair of transistors and the second transistor, the second logic circuit to receive the third signal and output an assert signal for asserting the third transistor responsive to the third signal being at a low logic level.

8. The voltage-level shifter of claim 7, wherein:
   when the second signal goes from a low logic level to a high logic level there is additional delay of deassertion of the first transistor by the first logic circuit relative to assertion of the first transistor by the first logic circuit when the second signal goes from a high logic level to a low logic level; and
   when the third signal goes from a low logic level to a high logic level there is additional delay of deassertion of the second transistor by the second logic circuit relative to assertion of the second transistor by the second logic circuit when the third signal goes from a high logic level to a low logic level.

9. The voltage-level shifter of claim 8, wherein:
   the additional delay of deassertion of the first transistor permits the first transistor to temporarily pass a deassert signal to the fourth transistor to speed transition of the fourth transistor from an on state to an off state; and
   the additional delay of deassertion of the second transistor permits the second transistor to temporarily pass a deassert signal to the third transistor to speed transition of the third transistor from an on state to an off state.

10. The voltage-level shifter of claim 9, wherein: the first logic circuit comprises a first two-input NAND gate, a first input of the first two-input NAND gate to receive the second signal, a second input of the first two-input NAND gate to receive the second signal after having been delayed by a first plurality of inverters and a first capacitor; and
   the second logic circuit comprises a second two-input NAND gate, a first input of the second two-input NAND gate to receive the third signal, a second input of the second two-input NAND gate to receive the third signal after having been delayed by a second plurality of inverters and a second capacitor.

11. An integrated circuit including the voltage-level shifter of claim 1.

12. The integrated circuit of claim 11, wherein the integrated circuit is one of a digital signal processor, a central processing unit, a field programmable gate array, or a memory.

13. A method for shifting an input voltage to a higher voltage through a voltage-level shifter, the method comprising:
   receiving the input voltage and inverting the input voltage into a first signal; and
   passing the first signal to a first transistor in the voltage-level shifter, the first signal being an assert signal for asserting the first transistor,
   wherein when asserted the first transistor is configured to pass an output voltage to an output of the voltage level shifter, the output voltage having a higher voltage level relative to the input voltage and wherein passing the first signal to a first transistor in the voltage-level shifter comprises passing the first signal through a second transistor in the voltage-level shifter having a thinner oxide relative to the first transistor, and wherein passing the first signal through a second transistor in the voltage-level shifter comprises asserting the second transistor through a first logic circuit, the first logic circuit receiving the first signal as input and outputting an assert signal for asserting the second transistor responsive to the first signal being at a low logic level, and wherein when the first signal goes from a low logic level to a high logic level there is additional delay of deassertion of the second transistor by the first logic circuit relative to assertion of the second transistor by the first logic circuit when the first signal goes from a high logic level to a low logic level and wherein: the first logic circuit comprises a first two-input NAND gate, a first input of the first two-input NAND gate to receive the first signal, a second input of the first two-input NAND gate to receive the first signal after having been delayed by a first plurality of inverters and a first capacitor.

* * * * *